United States Patent
Hartung et al.

(10) Patent No.: US 10,134,654 B2
(45) Date of Patent: Nov. 20, 2018

(54) DOUBLE-ENCAPSULATED POWER SEMICONDUCTOR MODULE AND METHOD FOR PRODUCING THE SAME

(71) Applicant: Infineon Technologies AG, Neubiberg (DE)

(72) Inventors: Hans Hartung, Warstein (DE); Reinhold Bayerer, Reichelsheim (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 15/660,087

(22) Filed: Jul. 26, 2017

(65) Prior Publication Data

US 2018/0033711 A1 Feb. 1, 2018

(30) Foreign Application Priority Data

Jul. 27, 2016 (EP) ..................... 16181357

(51) Int. Cl.
*H01L 23/48* (2006.01)
*H01L 23/31* (2006.01)
(Continued)

(52) U.S. Cl.
CPC .......... *H01L 23/3135* (2013.01); *H01L 21/52* (2013.01); *H01L 21/565* (2013.01); *H01L 23/053* (2013.01); *H01L 23/24* (2013.01); *H01L 23/296* (2013.01); *H01L 23/3121* (2013.01); *H01L 23/3735* (2013.01); *H01L 23/5386* (2013.01); *H01L 24/32* (2013.01); *H01L 24/48* (2013.01); *H01L 24/73* (2013.01); *H01L 24/29* (2013.01); *H01L 25/072* (2013.01);
(Continued)

(58) Field of Classification Search
CPC ... H01L 23/3135; H01L 21/52; H01L 21/565; H01L 23/053; H01L 23/296; H01L 23/3121; H01L 23/3735; H01L 23/5386; H01L 24/32; H01L 24/48; H01L 24/73
See application file for complete search history.

(56) References Cited

U.S. PATENT DOCUMENTS

| 7,038,322 B2 * | 5/2006 | Kazama | H01L 23/3114 257/669 |
| 2005/0167696 A1 * | 8/2005 | Sheng | H01L 25/072 257/177 |
| 2013/0161801 A1 * | 6/2013 | Otremba | H01L 23/24 257/668 |

FOREIGN PATENT DOCUMENTS

| JP | 2006351737 A | 12/2006 |
| JP | 2013004766 A | 1/2013 |
| JP | 2015193227 A | 11/2015 |

* cited by examiner

*Primary Examiner* — Alonzo Chambliss
(74) *Attorney, Agent, or Firm* — Murphy, Bilak & Homiller, PLLC

(57) ABSTRACT

One aspect relates to a power semiconductor module. The module includes a module housing, a substrate, and a semiconductor chip attached to the substrate. The semiconductor chip is disposed in the module housing. A dielectric first encapsulation is disposed in the module housing, in physical contact with both the semiconductor chip and the substrate and has a first modulus of elasticity. A dielectric second encapsulation is disposed in the module housing and has a second modulus of elasticity. The first encapsulation is a polymer and disposed between the substrate and the second encapsulation. The semiconductor chip is disposed between the first encapsulation and the substrate. Further, the first modulus of elasticity is greater than the second modulus of elasticity.

15 Claims, 5 Drawing Sheets

(51) Int. Cl.
  *H01L 21/52*   (2006.01)
  *H01L 21/56*   (2006.01)
  *H01L 23/053*  (2006.01)
  *H01L 23/29*   (2006.01)
  *H01L 23/373*  (2006.01)
  *H01L 23/538*  (2006.01)
  *H01L 23/00*   (2006.01)
  *H01L 23/24*   (2006.01)
  H01L 25/07    (2006.01)

(52) U.S. Cl.
  CPC .............. *H01L 2224/29101* (2013.01); *H01L 2224/29339* (2013.01); *H01L 2224/32225* (2013.01); *H01L 2224/32245* (2013.01); *H01L 2224/48091* (2013.01); *H01L 2224/48106* (2013.01); *H01L 2224/48227* (2013.01); *H01L 2224/48245* (2013.01); *H01L 2224/48472* (2013.01); *H01L 2224/73265* (2013.01); *H01L 2224/8384* (2013.01); *H01L 2224/83424* (2013.01); *H01L 2224/83447* (2013.01); *H01L 2224/8592* (2013.01); *H01L 2924/00014* (2013.01); *H01L 2924/1033* (2013.01); *H01L 2924/10253* (2013.01); *H01L 2924/10272* (2013.01); *H01L 2924/1304* (2013.01); *H01L 2924/13055* (2013.01); *H01L 2924/13064* (2013.01); *H01L 2924/13091* (2013.01); *H01L 2924/15787* (2013.01); *H01L 2924/16151* (2013.01); *H01L 2924/181* (2013.01)

DOUBLE-ENCAPSULATED POWER SEMICONDUCTOR MODULE AND METHOD FOR PRODUCING THE SAME

BACKGROUND

Power semiconductor modules include, for example, a substrate carrying at least one semiconductor chip. In order to protect the semiconductor chip(s) against harmful environmental impact, creeping currents and electric sparkover, a dielectric silicone gel that directly contacts and covers the substrate and the semiconductor chip(s) is filled in a module housing. Silicone gels are used as encapsulation materials because they are, as compared to hard encapsulation compounds like epoxy resin or rubber, considered to be soft enough as to not cause substantial thermomechanical stress during thermal cycling of the module. Such thermomechanical stress may, for instance, severe connections between a metallization of the chip or substrate and a bond wire bonded to that metallization. Power semiconductor modules with several electric terminals and high voltages applied between these terminals may contain an encapsulation that covers the semiconductor chip(s) and extends up to the height at which the plastic material of the module housing encloses the terminals. The encapsulation may form a layer having a thickness of more than 10 mm, for example 20 mm. Such a thick encapsulation layer may again cause high pressure and stress due to its high coefficient of thermal expansion and its large volume. To withstand high operating temperatures of above 150° C., the encapsulation may have a penetration of 30 (according to DIN ISO 2137:2007) or less, which means that the encapsulation is comparatively hard, increasing the stress even further. Hence there is a general need for a power semiconductor module having an encapsulation that is able to withstand high operating temperatures without exerting thermomechanical stress on other elements of the power semiconductor module, and for a method for producing such a power semiconductor module.

SUMMARY

According to one aspect, a power semiconductor module includes a module housing, a substrate, and a semiconductor chip that is attached to the substrate. The semiconductor chip is disposed in the module housing. A dielectric first encapsulation is disposed in the module housing, in physical contact with both the semiconductor chip and the substrate and has a first modulus of elasticity. A dielectric second encapsulation is disposed in the module housing and has a second modulus of elasticity. The first encapsulation is a polymer and disposed between the substrate and the second encapsulation. The semiconductor chip is disposed between the first encapsulation and the substrate. Further, the first modulus of elasticity is, for instance at a temperature of 25° C., greater than the second modulus of elasticity.

According to a further aspect, a method for producing a power semiconductor module includes coating a substrate with a semiconductor chip and the semiconductor chip attached to it with a dielectric first encapsulation so that the first encapsulation is in physical contact with both the semiconductor chip and the substrate, and curing the first encapsulation so that is has a first modulus of elasticity. A dielectric second encapsulation is disposed on the first encapsulation (e.g. in the form of a first encapsulation compound) and cured so that it has a second modulus of elasticity. The first modulus of elasticity is greater than the second modulus of elasticity. The cured first encapsulation is a polymer, and the semiconductor chip, the first encapsulation and the second encapsulation are disposed inside a module housing.

BRIEF DESCRIPTION OF THE DRAWINGS

The power semiconductor modules and methods for producing the same may be better understood with reference to the following drawings and description. The components in the figures are not necessarily to scale, emphasis instead being placed upon illustrating the principles of the invention. Moreover, in the figures, like referenced numerals designate corresponding parts throughout the different views.

DETAILED DESCRIPTION

A power semiconductor module may have a first encapsulation which electrically insulates parts which are operated at significantly different electric potentials, e.g. chip terminals like source, drain and gate terminals of power semiconductor chips, different metal sections of a substrate, etc., against one another. Because of narrow distances between such parts, e.g. between a chip terminal of a semiconductor chip and a metallization of a substrate on which the semiconductor chip is disposed, a good adhesion, a high mechanical strength and a high dielectric strength help preventing a degradation of the electrical insulation caused by the encapsulation. At distances from the substrate greater than the thickness of the semiconductor chip, the distances between parts that are operated at significantly different electric potentials may be larger. Therefore, a second encapsulation disposed on the first encapsulation may have a dielectric strength lower than the dielectric strength of the first encapsulation. Nevertheless, the larger distances may be too short to function without this second encapsulation, as adhesion and inner mechanical strength may be compromised.

Figure 1A:
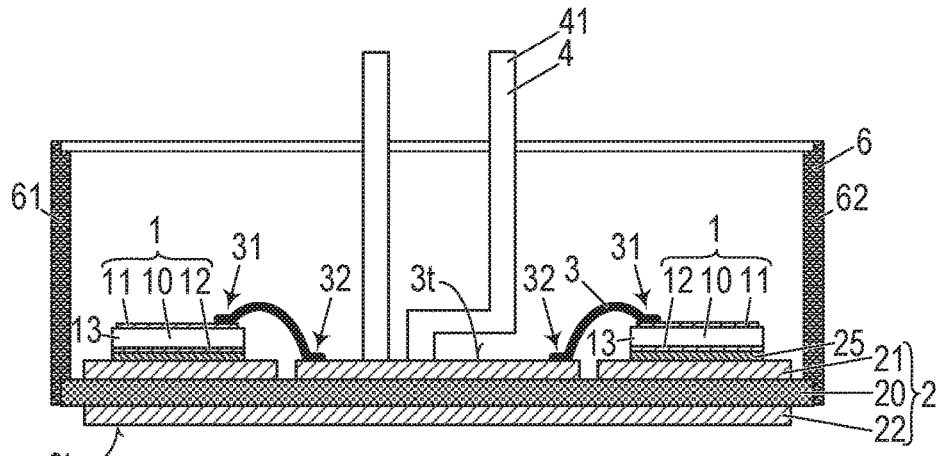
FIGS. 1A to 1C are schematic diagrams illustrating different steps in the production of a power semiconductor module according to a first example.
Figure 1B:
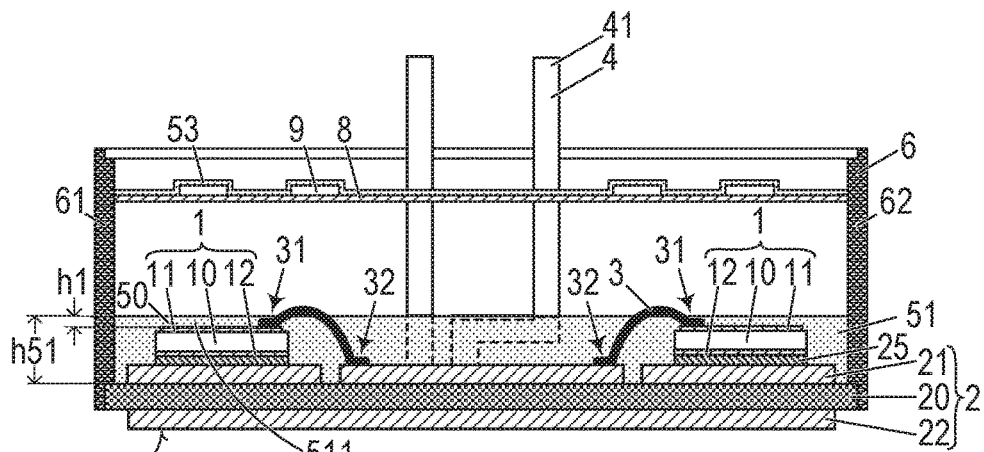
Figure 1C:
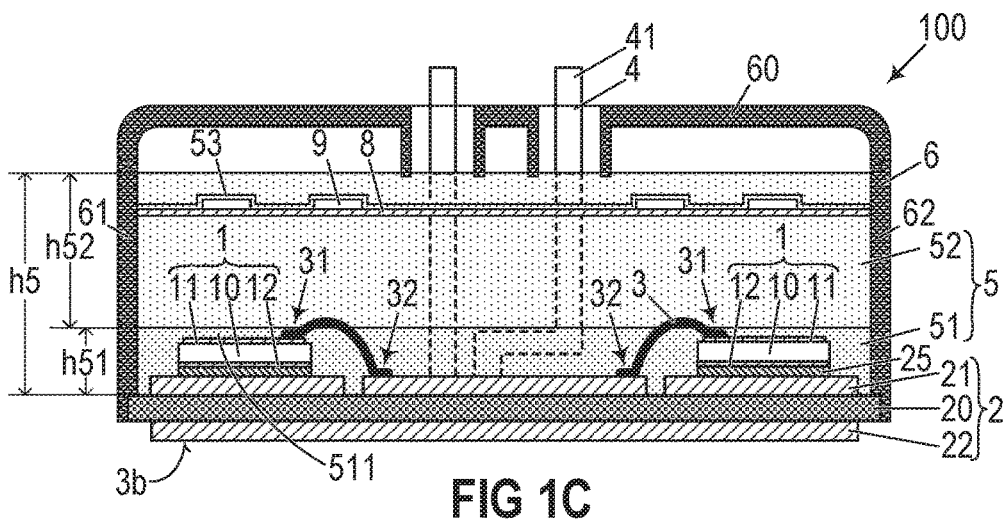

FIG. 1C shows a first exemplary completed power semiconductor module 100 which has a substrate 2, one or more semiconductor chips 1 attached to the substrate 2, a continuous polymeric first encapsulation 51, and a second encapsulation 52 disposed at least on a surface of the first encapsulation 51 that faces away from the substrate 2. In the sense of the present specification, an object is regarded to be "continuous" if between each first point of the object and each second point of the object different from the first point there is an uninterrupted path between the first point and the second point which exclusively passes through the object. Optionally, the first encapsulation 51 may adjoin both the second encapsulation 52 and the substrate 2, i.e., the first encapsulation 51 is in physical contact with both the second encapsulation 52 and the substrate 2. In contrast to this, the second encapsulation 52 may optionally be disposed distant from the at least one of the semiconductor chip 1 and the substrate 2.

The polymeric first encapsulation 51 may continuously extend from the substrate 2 to at least above the semiconductor chip 1, i.e. at least to a surface of the semiconductor chip 1 that faces away from the substrate 2. That is, the first encapsulation 51 has a section 511 which is disposed on that surface of the semiconductor chip 1 that faces away from the substrate 2. That is, the semiconductor chip 1 is disposed between a section 511 of the first encapsulation 51 and the substrate 2. Optionally, the semiconductor chip 1 may be completely arranged between the section 511 and the substrate 2, which means that that surface of the semiconductor chip 1 facing away from the substrate 2 is completely covered by the section 511 and therefore by the first encapsulation 51.

Optionally, a semiconductor module 100 may include one and only one first encapsulation 51, or at least two first encapsulations 51. In the case of at least two first encapsulations 51, each first encapsulation 51 is "continuous" but disposed distant from each of the other first encapsulations 51. Optionally, each of one or more first encapsulations 51 may adjoin the substrate 2 and have a section 511 covering a semiconductor chip 1 so that the semiconductor chip 1 is disposed between that section 511 and the substrate 2. In case of more than two first encapsulations, at least two or even all first encapsulations 51 may have the same material composition and have, in the cured state and at the same temperature, a same first modulus of elasticity.

The one or more semiconductor chips 1 may be attached to the substrate 2 using an assembly layer 25 that is disposed between the substrate 2 and the respective semiconductor chip 1 and that continuously extends between the substrate 2 and the respective semiconductor chip 1. Such a connection layer 25 may be electrically conductive or electrically insulating. For instance, suitable electrically conductive assembly layers 25 may consist of or have one of the following: a solder, a sintered metal powder (e.g., a sintered silver powder), or an electrically conductive adhesive. A suitable electrically insulating connection layer 25 may consist of or have an electrically insulating adhesive.

Each semiconductor chip 1 has a semiconductor body 10 and may further have a first chip metallization 11 and a second chip metallization 12 both disposed on the semiconductor body 10. As illustrated in FIG. 1C, the first and second chip metallizations 11, 12 may be disposed on opposite surfaces of the semiconductor body 10. Alternatively, both the first and second chip metallizations 11, 12 may be disposed on a first surface of the semiconductor body 10 that faces away from the substrate 2. Optionally, the semiconductor body 10 may be monocrystalline or substantially monocrystalline and include silicon, silicon carbide, gallium nitride or any other semiconductor material suitable for forming semiconductor devices. The semiconductor body 10 may have one or more semiconductor regions doped with electrically active dopants, i.e. with dopants causing the respective semiconductor region to be n-doped or p-doped.

The semiconductor chip 1 may have a semiconductor device that has a load path formed between the first and second chip metallizations 11 and 12. The semiconductor device may be, for instance, a diode, or a controllable semiconductor device like a unipolar or bipolar transistor, or a thyristor. In case of a transistor, the controllable semiconductor device may be, for instance, a MOSFET (Metal Oxide Semiconductor Field-Effect Transistor), an IGBT (Insulated Gate Bipolar Transistor), a HEMT (High Electron Mobility Transistor), or any other transistor. In one example, the semiconductor device, e.g. one of the semiconductor devices mentioned above, may optionally be a vertical semiconductor device.

The first chip metallization 11 and the second chip metallization 12 may be a source metallization and a drain metallization, or a drain metallization and a source metallization, or an emitter metallization and a collector metallization, or collector metallization and an emitter metallization, or an anode metallization and a cathode metallization, or a cathode metallization and an anode metallization.

In case of a controllable semiconductor device, the semiconductor chip 1 has a third chip metallization (not shown) that is disposed either on the first surface of the semiconductor body 10 (i.e. the surface of the semiconductor body 10 facing away from the substrate 2), or on the second surface (i.e. the surface of the semiconductor body 10 facing toward the substrate 2). Such a third chip metallization may be a gate metallization or a base metallization.

Using at least one semiconductor chip 1, the semiconductor module 100 may include, for instance, a controllable semiconductor switch, a half-bridge, two half-bridges (e.g. a H-bridge), three half-bridges, multilevel circuits, or any other configuration. In a half-bridge, the load paths of two semiconductor chips 1 are electrically connected in series.

During the operation of a power semiconductor module 100, a high electrical potential difference may be at least temporarily present between the first chip metallization 11 and the second chip metallization 12. For instance, the respective semiconductor device integrated in the semiconductor chip may have a high voltage blocking capability, for instance at least 300 V, at least 600 V, or at least 1200 V.

The substrate 2 may be any substrate that is typically used for carrying one or more semiconductor chips. The substrate 2 may have a dielectric insulation carrier 20 and a first substrate metallization layer 21 disposed on a first surface of the insulation carder 20. Optionally, the substrate 2 may also have a second substrate metallization layer 22 disposed on a second surface of the insulation carrier 20. That is, if there is a second substrate metallization layer 22, the first substrate metallization layer 21 and the second substrate metallization layer 22 may be disposed on opposite sides of the insulation carrier 20.

For instance, a substrate 2 may be a printed circuit board (PCB) or an IMS (insulated metal substrate). In one example, the substrate 2 may be a ceramic substrate 2 in which the dielectric insulation carrier 20 is a ceramic, for instance a thin ceramic layer. The ceramic may be, for example, composed of or include aluminum oxide ($Al2O3$), aluminum nitride (AlN) or zirconium oxide ($ZrO2$), silicon nitride, boron nitride, or any other ceramic. A ceramic substrate 2 may be, e.g., a DCB substrate (DCB=Direct Copper Bonding), a DAB substrate (DAB=Direct Aluminum Bonding), an AMB substrate (AMB=Active Metal Brazing) or an IMS substrate (IMS=Insulated Metal Substrate).

Instead of only one dielectric insulation carrier 20 and one or two substrate metallization layers 21, 22 adjoining that insulation carrier 20, a substrate 2 may have a stack including at least two stacked dielectric insulation carriers 20, between each pair of adjacent dielectric insulation carriers 20 at least one intermediate metallization layer, a first substrate metallization layer 21 and, optionally, a second substrate metallization layer 22. The first substrate metallization layer 21 may optionally form a topmost layer of the stack and, therefore, have an exposed first surface 3t. Also optionally, the second substrate metallization layer 22 may form a bottommost layer of the stack and, therefore, have an exposed second surface 3b. If the substrate 2 has both a first substrate metallization layer 21 and a second substrate metallization layer 22, the first and second surfaces 3t, 3t may form opposite surfaces of the substrate 2.

Each of the at least two dielectric insulation carriers 20 of the stack may consist of or include one of the materials mentioned above. For instance, all two dielectric insulation carriers 20 of the stack may consist of or include the same material. Alternatively, different dielectric insulation carriers 20 of the stack may consist of or include different materials. Accordingly, each of the metallization layers of the stack (i.e. the first metallization layer 21, all intermediate metallization layer(s), and, if provided, the optional second metallization layer 22), may consist of or include the same material, for instance one of the above-mentioned materials with respect to the first metallization layer 21 and the optional second substrate metallization layer 22. Alternatively, different metallization layers of the stack may consist of or include different materials.

At least one of the first substrate metallization layer 21 and the second substrate metallization layer 22 may be provided in the form of pre-fabricated metal foils that are attached to the insulation carrier 20. Alternatively or additionally, at least one of the first substrate metallization layer 21 and the second substrate metallization layer 22 may be formed by depositing an electrically conductive material, e.g. a metal, on the insulation carrier 20. Suitable techniques are, for instance, depositing a metal powder (e.g. copper, silver, etc.) and subsequently sintering and/or firing the deposited metal powder so as to form the substrate metallization layer(s) 21 and/or 22. In one example, copper print-and-fire technology may be used.

At least one of the first substrate metallization layer 21 and (if provided) second substrate metallization layer 22 may each have, independently of one another, a thickness in the range of 0.05 mm to 2.5 mm. The thickness of the insulation carrier 20 may be, e.g., in the range of 0.1 mm to 2 mm. However, thicknesses that are larger or smaller than those indicated are equally possible.

Metals having good electrical conductivity such as, for example, copper or copper alloys, aluminum or aluminum alloys are suitable as materials for the relevant first substrate metallization layer 21 and second substrate metallization layer 22. At least one of the first substrate metallization layer 21 and (if provided) second substrate metallization layer 22 may be provided in the form of pre-fabricated metal foils and attached to the insulation carrier 20. As illustrated in FIG. 1C, the first substrate metallization layer 21 may be structured to have at least one of conductive lines and pads.

If the second chip metallization 12 of a semiconductor chip 1 is disposed on that side of the chip's 1 semiconductor body 10 facing towards the substrate 2, the second chip metallization 12 may be electrically connected to the first substrate metallization layer 21, e.g. using an electrically conductive connection layer 25 as described above that continuously extends between second chip metallization 12 and the first substrate metallization layer 21.

Optionally, the power semiconductor module 100 may have a module housing 6 that may be configured in any desired fashion. In one example, it may consist of or include an electrically insulating material, for example plastic, e.g. a thermoplastic or thermoset. The module housing 6 may be embodied in an integral fashion, or else be composed of two or more housing parts. For instance, a module housing 6 may have a ring-shaped frame having side walls (reference numerals 61 and 62 designate two of such side walls), and, optionally, a lid 60. The lid 60 and the ring-shaped frame may be formed in an integral fashion, or else be separate parts. Optionally, the module housing 6 may be dielectric, and, optionally, include a material that is different from the materials of both the first encapsulation 51 and the second encapsulation 52.

In all examples, the semiconductor module 100 may have a plurality of electrical conductors 4 such as sheet metal or pins comprising in each case one or a plurality of electrical terminals 41 exposed on the outside of the module housing 6 so that the terminals 41 are accessible from outside the power semiconductor module 100.

According to one option, the plurality of electrical terminals 41 may be disposed at that side of the semiconductor module that is opposite the substrate 2. If the module housing has a lid 60, the plurality of electrical terminals 41 may be disposed on that side of the lid 60 that faces away from the substrate 2.

According to a further option, one or more of the plurality of electrical terminals 41 may be part of an electrical conductor 4 in every case, wherein the electrical conductor 4 may be electrically connected to the first substrate metallization layer 21 and penetrates both the first encapsulation 51 and the second encapsulation 52 such that both the first encapsulation 51 and the second encapsulation 52 directly contact (touch) the respective electrical conductor 4.

In order to keep the illustration simple, FIG. 1C illustrates only two electrical conductors 4. As also illustrated in FIG. 1C, all or at least some of the module's terminals 41 may be disposed on that side of the module housing 6 that faces away from the substrate 2. Alternatively or in addition, all or at least some of the module's terminals 41 may be disposed in a lateral direction on the outside of the module housing 6.

The electrical terminals 41 may be designed in any manner allowing them to be electrically connected. For instance, the electrical terminals may be embodied as so-called "press-fit" terminals in accordance with DIN 41611-9:1987-12: "Lötfreie elektrische Verbindungen; Abisolierfreie Wickelverbindungen; Begriffe, Kennwerte, Anforderungen, Prüfugen", or in accordance with DIN EN (LEC) 60352-5, 2008-11: "Lötfreie Verbindungen—Teil 5: Einpressverbindungen—Allgemeine Anforderungen, Prüfverfahren and Anwendungshinweise (IEC 60352-5: 2008)" (editions as relevant on May 30, 2016), both obtainable from Beuth Verlag GmbH, Berlin. As an alternative to press-fit contacts, the electrical terminals 41 may also be realized as soldering terminals, as welding terminals, as screw terminals, or as resilient contact springs.

Optionally, the semiconductor module 100 may include at least one bond wire 3 directly bonded at a first bonding location 31 to a first chip metallization. In FIG. 1C, such a first chip metallization is the first chip metallization 11. In cases where the second chip metallization 12 or any other chip metallization, such as a gate metallization, is disposed on that side of the semiconductor chip's 1 semiconductor body 10 that faces away from the substrate 2, the one bond wire 3 might also be directly bonded to the second chip metallization 12 or the gate metallization.

A bond wire 3 that is bonded at a first bonding location 31 to a chip metallization may further be bonded at a second bonding location 32 to any other element of the semiconductor module 100 in order to electrically connect the other element to the respective chip metallization. In the example of FIG. 1C, the other element is the first substrate metallization layer 21 of the substrate 2. However, the other element may also be, for instance, a metallization of a further semiconductor chip 1 or an electrical conductor 4 as described above.

Independent of where the second bonding location 32 is localized, the bond wire 3 is embedded in the polymeric first encapsulation 51 at least at the first bonding location 31. This means that the bond wire 3 is, on its side that faces away from the semiconductor chip 1 and at least at the first bonding location 31, covered by the first encapsulation 51.

As also illustrated in FIG. 1C, the bond wire 3 may be embedded in the polymeric first encapsulation 51, also at least at the second bonding location 32. This means that the bond wire 3 is, on its side that faces away from the substrate 2 and at least at the second bonding location 32, covered by the first encapsulation 51.

Optionally, one, more or all semiconductor chips 1 may be completely embedded in the first encapsulation 51 so that the first encapsulation 51 physically contacts the semiconductor chip(s) 1.

The second encapsulation 52 is disposed at least on that side of the first encapsulation 51 that faces away from the substrate 2 so that the first encapsulation 51 is disposed completely or at least partly between the substrate 2 and the second encapsulation 52.

Optionally, the first encapsulation 51 may have, for instance at a temperature of 25° C. (optionally for each temperature between −40° C. and +200° C. or even for each temperature between −55° C. and +200° C.), a modulus of elasticity greater than a modulus of elasticity of the second encapsulation 52, and extend from the substrate 2 to at least above the semiconductor chip 1, covering the semiconductor chip 1. This means that at least a thin layer of the first encapsulation 51 covers the first chip metallization 11 on that side of the first chip metallization 11 that faces away from the substrate 2. In the sense of the present specification, the modulus of elasticity of the first encapsulation 51 is also referred to as "first modulus of elasticity", and the modulus of elasticity of the second encapsulation 52 is also referred to as "second modulus of elasticity".

The improved power semiconductor module should have an encapsulation that electrically insulates the high voltage terminals of the power semiconductors, which terminals are operated at significantly different voltages, from one another, and that fills the space between metal parts operated at significantly different voltages, for instance grooves separating different sections of the first substrate metallization layer 21. Because of the narrow distances between the chip terminals and the substrate layout, this encapsulation may have good adhesion, high mechanical strength and high dielectric strength. For the parts disposed above the level of the surface of the semiconductor chip the distances between parts that are operated at significantly different voltage are larger. Therefore, the second encapsulation may have less dielectric strength than the first encapsulation. The distances, however, are too short to omit the second encapsulation as adhesion and inner mechanical strength can be compromised.

A first effect of using a first encapsulation 51 that is, in the cured state, to a certain extent elastic, is that it does not exert substantial thermomechanical stress on the semiconductor chips and the bond wires b 3. Therefore, the elasticity of the first encapsulation 51 (which nevertheless is harder than the second encapsulation 52) helps to prevent damage such as chip cracks or the lifting-off of bond wires 3 from a chip metallization 11. If a mold compound is used as first encapsulation 51, one effect is that the coefficient of thermal expansion (CTE) can easily be adjusted to match or approximately match the CTE of a semiconductor chip 1 or a substrate 2 or a metal, thus reducing thermomechanical stress. Adjusting the CTE may take place using a filler, e.g. a ceramic powder or any other suitable filler material that is dispersed in a base material of the mold compound. A suitable base material is, for instance, a silicone, an epoxy resin, a polyurethane, or an acrylic resin, or any other suitable base material. The CTE of the cured first encapsulation 51 may be adjusted by appropriately adjusting the filler content. However, a base material, in particular one of the base materials mentioned above, may also be used alone, i.e. without a filler. On the other hand, the cured mold compound provides for high mechanical strength, good adhesion and high dielectric strength.

A second effect is that, in contrast to soft gels typically used in conventional power semiconductor modules, the comparatively hard first encapsulation 51 does not tend to form bubbles/voids when it is heated during the operation of the power semiconductor module 100. Such heating may result from the inevitable energy dissipation of the semiconductor chips 1. Bubbles reduce the dielectric strength of the power semiconductor module 100. Therefore, the comparatively hard first encapsulation 51 helps to maintain the module's 100 dielectric strength.

Suitable materials that may be used as the first encapsulation 51 are, for instance, hard silicone gels, elastic silicone rubbers, or encapsulation material such as mold epoxy, which has a CTE (Coefficient of Thermal Expansion) of between 3 ppm/K to 17 ppin/K, thus keeping the thermomechanical stress low.

Suitable materials that may be used as the second encapsulation 52 are, for instance, gels (e.g. silicone gels) and foams (e.g., silicone foams), which include a rubber containing gas-filled voids. Foams are soft as the voids allow for deformation of the material under low forces.

The second encapsulation material 52 is used in addition to the first encapsulation material 51 in order to dielectrically isolate and encapsulate the interior of the module housing 6 above the power semiconductor chips 1. As the second encapsulation material 52 is disposed distant from the power semiconductor chips 1, the second encapsulation material 52 is not directly exposed to the high electric fields that appear where the distances between voltage-carrying parts are small. Therefore, the tendency to form bubbles will not affect the electrical isolation within the semiconductor module.

Using a soft second encapsulation material 52 has the effect that the height (thickness) h51 of the comparatively hard first encapsulation material 51 can be limited to a minimum so that the thermomechanical stress that occurs at interfaces between the first encapsulation material 51, on the one hand, and the substrate 2, the semiconductor chips 1, the bond wires 3 and the module housing 6, on the other, is not too high. The height h51 may be, for instance, less than the thickness of the semiconductor chip 1 (e.g. from 40 μm to 650 μm, which may depend on the blocking voltage of the semiconductor chip 1) plus 400 μm.

A layer of the first encapsulation material 51 may cover a semiconductor chip 1 on its side that faces away from the substrate 2. The thickness h1 of such a layer may be, for instance, less than 1 mm. The second encapsulation material 52 may have a height (thickness) h52 that is, for instance, at least 3 mm. The common height (thickness) h5 of the first and second encapsulation materials 51, 52 may be, for instance, at least 5 mm, at least 10 mm, or even at least 14 mm.

The mentioned heights/thicknesses h1, h5, h51, h52 are measured perpendicular to the top surface of the substrate 2.

Optionally, the power semiconductor module 100 may include a control circuit for controlling one of, some of or all of the semiconductor chips 1 of the power semiconductor module 100. The control circuit may have a circuit board 8, e.g. a printed circuit board (PCB), and one or more active and/or passive electronic components 9 disposed on the circuit board 8. Although not illustrated in detail in FIG. 1C, the electronic circuit formed on the circuit board 8 may be electrically connected to at least one of the electrical conductors 4 and an electronic circuit formed on the substrate 2. In order to protect the electronic components 9 disposed on the circuit board 8, the electronic components 9 or the whole circuit board 8 including the electronic components 9 disposed thereon may be covered by a third encapsulation 53.

If the power semiconductor module 100 includes a circuit board 8, the circuit board 8 with the electronic components 9 and, if provided, the third encapsulation 53 is disposed inside the module housing 6 and on that side of the at least one semiconductor chip 1 that faces away from the substrate 2. The circuit board 8 may also be coated by the third encapsulation prior to disposing the circuit board 8 and the electronic components 9 thereon inside the module housing 6. Further examples of power semiconductor modules 100 having the same properties as described above with reference to FIG. 1C are illustrated in FIGS. 2C, 3C and 4E.

Referring to FIGS. 1C, 2C, 3C and 4E, one, more or all semiconductor chips 1 may be completely embedded in the first encapsulation 51 so that the second encapsulation 52 is disposed distant from these semiconductor chips 1.

Figure 2A:
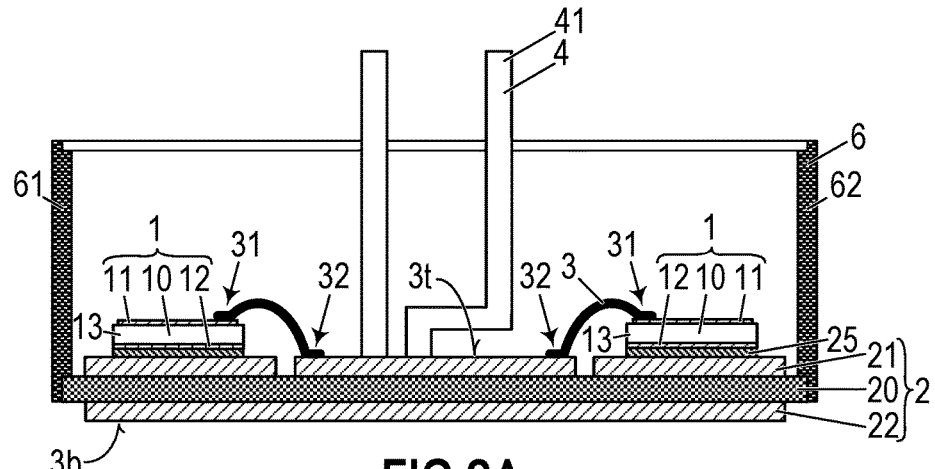
FIGS. 2A to 2C are schematic diagrams illustrating different steps in the production of a power semi-conductor module according to a second example.
Figure 2B:
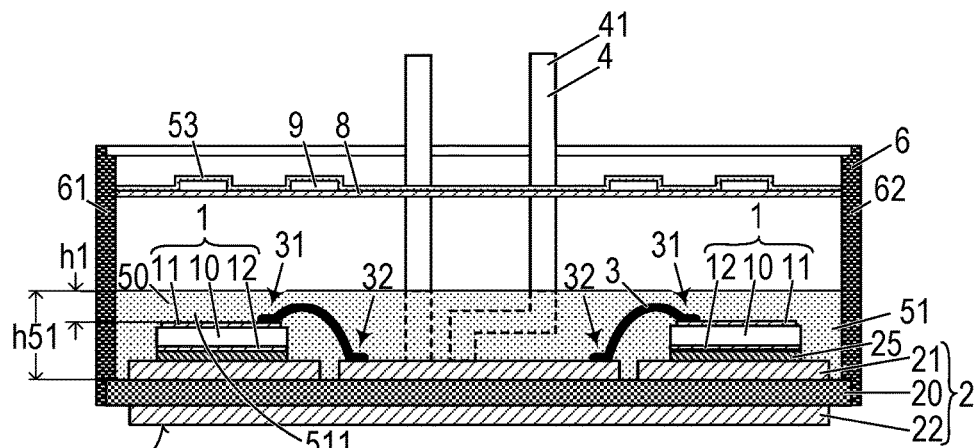
Figure 2C:
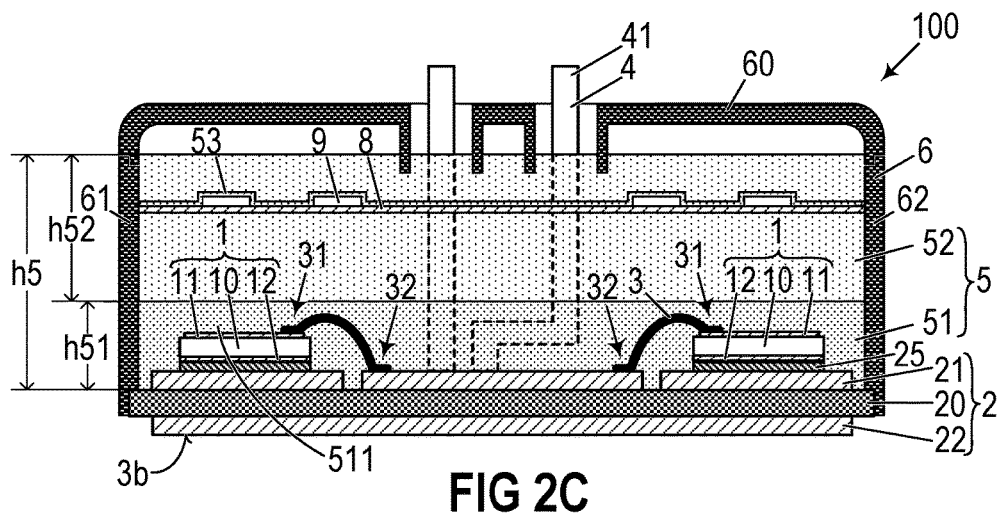
Figure 3A:
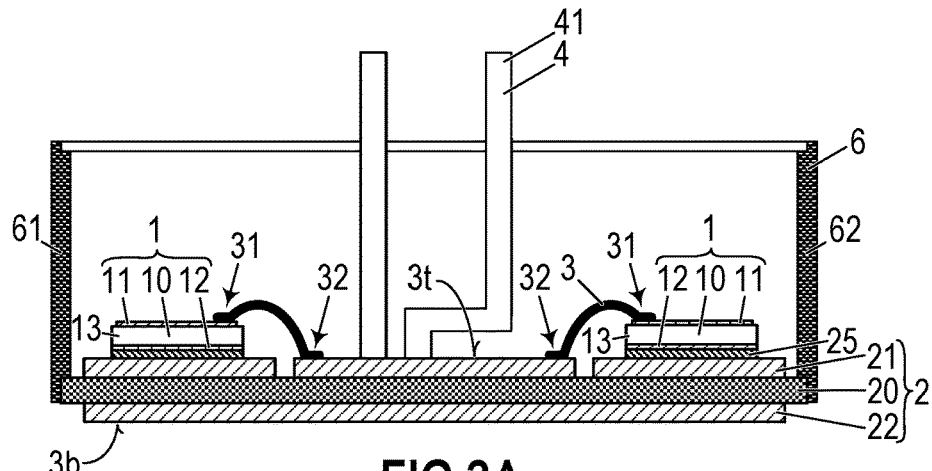
FIGS. 3A to 3C are schematic diagrams illustrating different steps in the production of a power semiconductor module according to a third example.
Figure 3B:
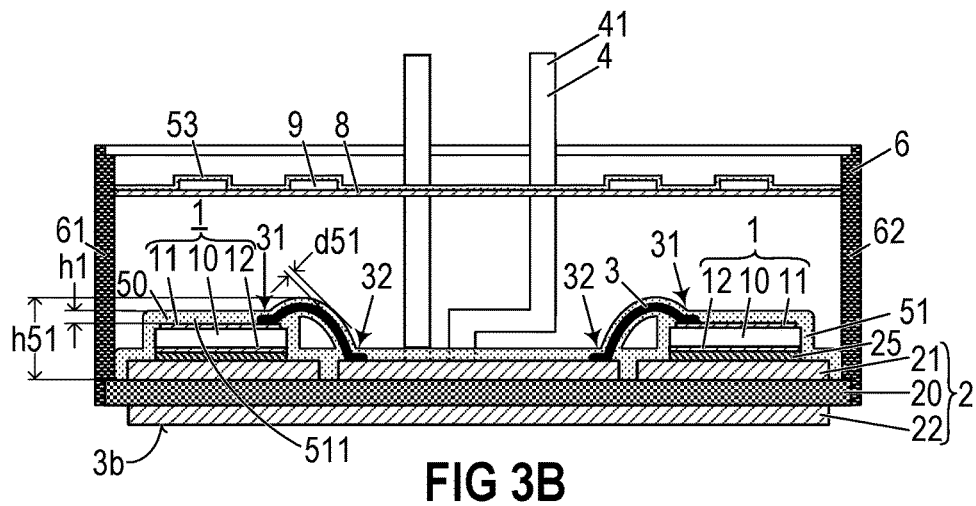
Figure 3C:
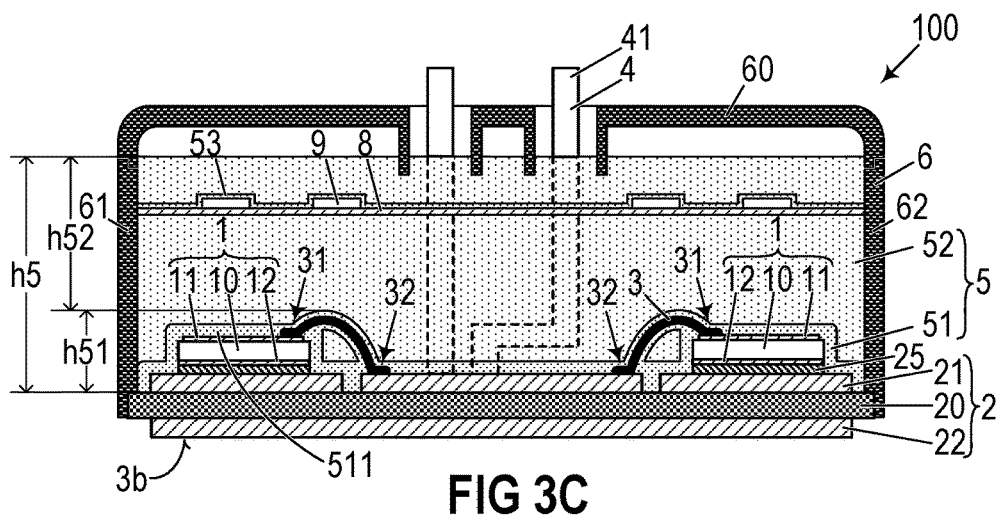
Figure 4A:
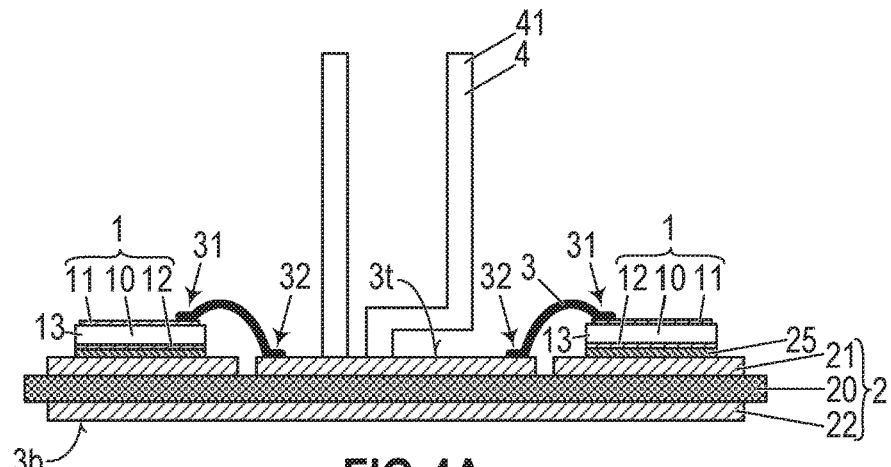
FIGS. 4A to 4E are schematic diagrams illustrating different steps in the production of a power semiconductor module 100 according to a fourth example.
Figure 4B:
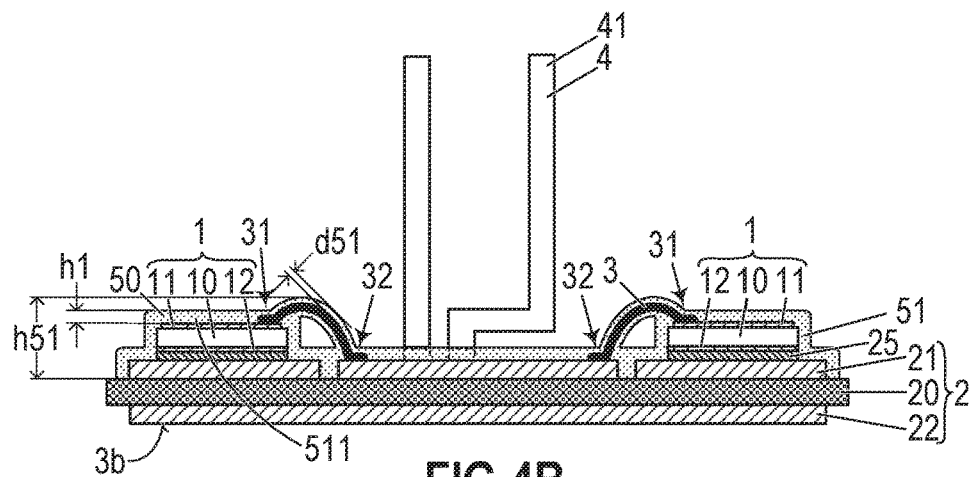
Figure 4C:
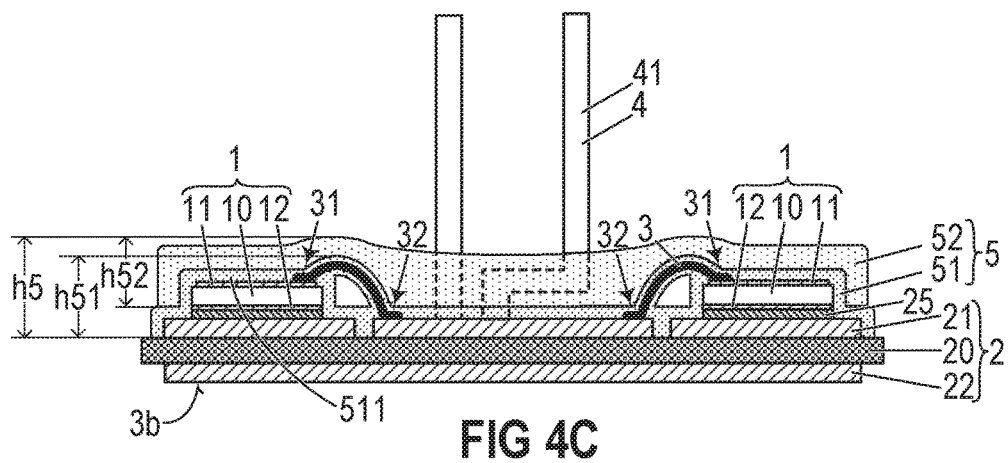
Figure 4D:
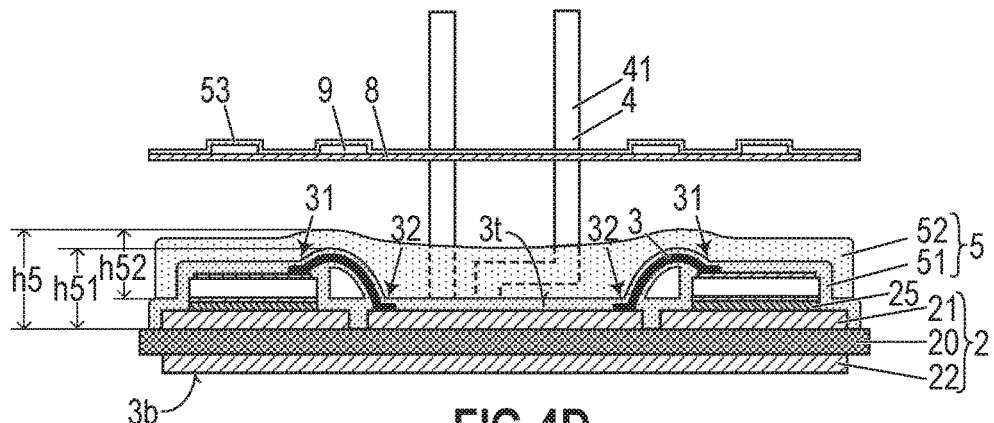
Figure 4E:
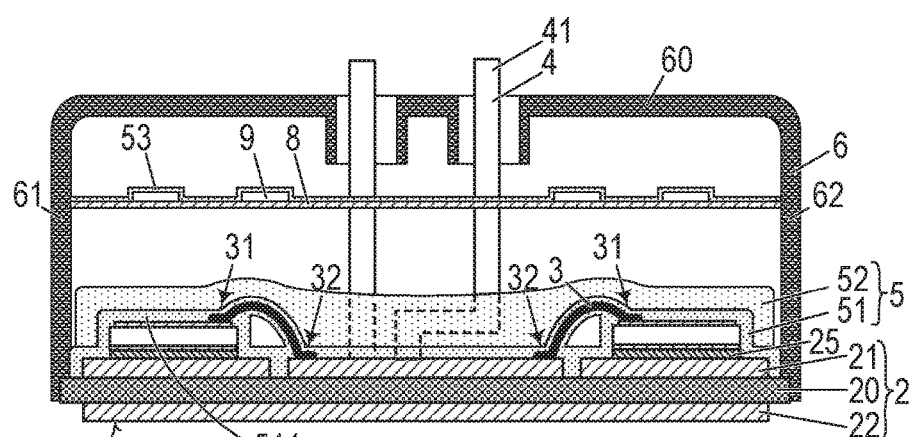

Referring to FIGS. 2C, 3C and 4E, one, more or all bond wires 3 may be completely embedded in the first encapsulation 51 so that the second encapsulation 52 is disposed distant from these bond wires 3.

Referring to FIGS. 2C, 3C and 4E, one, more or all bond wires 3 may be completely embedded in the first encapsulation 51 so that the second encapsulation 52 is disposed distant from these bond wires 3. Referring to FIG. 1C, one, more or all bond wires 3 may in each case be partly embedded in both the first and second encapsulation 51, 52.

In the power semiconductor module 100, the at least one semiconductor chip 1 is attached to the substrate 2, see FIGS. 1A, 2A, 3A and 4A.

The substrate 2 and the at least one semiconductor chip 1 are coated with a polymeric first encapsulation 51 such that the first encapsulation 51 extends from the substrate 2 to at least above the at least one semiconductor chip 1 and covers the at least one semiconductor chip 1, see FIGS. 1B, 2B, 3B and 4B. A second encapsulation 52 is disposed at least on that side of the first encapsulation 51 that faces away from the substrate 2. The first encapsulation 51 and the second encapsulation 52 are cured whereby any order of curing the first and second encapsulation 51, 52 is possible.

For instance, the first encapsulation 51 may be cured prior to and/or when and/or after the second encapsulation 52 is disposed at least on that side of the first encapsulation 51 that faces away from the substrate 2. That is, the second encapsulation 52 may be disposed at least on that side of the first encapsulation 51 that faces away from the substrate 2 when the first encapsulation 51 is uncured, partly cured or completely cured. The cured first encapsulation 51 may be elastic and have a first modulus of elasticity greater than a second modulus of elasticity of the cured second encapsulation 52.

Prior to being coated with the polymeric first encapsulation 51, the at least one semiconductor chip 1 may be a bare semiconductor die, i.e. an unpackaged semiconductor die so that the cured first encapsulation 51 adjoins the semiconductor body 10 and therefore a semiconductor material 13 of the semiconductor body 10 of at least one semiconductor chip 1. A semiconductor chip 1 does not require its own, individual chip package as the first encapsulation 51 provides for sufficient electrical insulation and passivation of the semiconductor chip 1. That is to say, an individual chip package of the at least one semiconductor chip 1 may be omitted.

Prior to coating, the substrate 2 and the at least one semiconductor chip 1 with the polymeric first encapsulation 51, a module housing 6 or at least a ring-shaped housing frame having side walls 61, 62 may be attached to the substrate 2 equipped with the at least one semiconductor chip 1 and the bond wires 3, see FIGS. 1A, 2A and 3A. Doing so is useful when the uncured first encapsulation 51 has a low viscosity as the housing 6 or housing frame prevents the uncured first encapsulation 51 from flowing away, see FIGS. 1B and 2B.

Alternatively, a module housing 6 or at least a ring-shaped housing frame having side walls 61, 62 may be attached to the substrate 2 equipped with both the at least one semiconductor chip 1 and the bond wires 3 after the substrate 2 and the at least one semiconductor chip 1 are coated with the polymeric first encapsulation 51, or even after the second encapsulation 52 is disposed on the first encapsulation 51, see FIG. 4D in comparison to FIG. 4E.

Suitable techniques for coating the substrate 2 and the at least one semiconductor chip 1 with the polymeric first encapsulation 51 are, for instance, molding (see FIGS. 1B and 2B), injection molding, conformal and non-conformal deposition, dispensing, spin coating, or any other suitable technique. The same techniques may also be used for disposing the second encapsulation 52 on at least that side of the first encapsulation 51 that faces away from the substrate 2. Thereby, each of the above-mentioned techniques used for coating the substrate 2 and the at least one semiconductor chip 1 with the polymeric first encapsulation 51 may be combined with any of the above-mentioned techniques for disposing the second encapsulation 52 on at least that side of the first encapsulation 51 that faces away from the substrate 2.

In those cases in which the cured first encapsulation 51 forms a conformal coating, it may have a layer thickness d51 of more than 100 µm, see, for instance, FIGS. 3B and 4B. In those cases in which at least one of the encapsulations 51 and 52 does not form a conformal coating, the substrate 2 and the at least one semiconductor chip 1 attached thereto may be mounted in the module housing 6 or on a frame 61, 62 of the module housing 6. Then, the at least one of the encapsulation(s) 51 and 52 may be poured in the module housing 6 or the frame 61, 62 and subsequently cured.

Where a power semiconductor module 100 is to be provided with a circuit board 8 that is equipped with electronic components 9, the equipped circuit board 8 may be embedded in the second encapsulation 51, see FIGS. 1C, 2C and 3C. Alternatively, the equipped circuit board 8 may be disposed above the second encapsulation 52, i.e., on that side of the second encapsulation 52 that faces away from the substrate 2, see FIGS. 4D and 4E. In each of the mentioned alternatives, the electronic components 9 may either be covered with the third encapsulation 53, or a third encapsulation 53 may be omitted.

The following table illustrates eight (non-limiting) examples of possible combinations of a first encapsulation 51 and a second encapsulation 52 (at temperatures of 25° C. in each case):

| Example | first encapsulation (51) | second encapsulation (52) |
|---|---|---|
| 1 | silicone having a modulus of elasticity >0.14 MPa | gel having a modulus of elasticity <0.1 MPa |
| 2 | gel having a modulus of elasticity >0.14 MPa | gel having a modulus of elasticity <0.1 MPa |
| 3 | gel having a modulus of elasticity >0.14 MPa | silicone foam having a modulus of elasticity <0.1 MPa |
| 4 | silicone having a modulus of elasticity >0.14 MPa | silicone foam having a modulus of elasticity <0.1 MPa |
| 5 | mold compound having a modulus of elasticity >1 GPa and a coefficient of thermal expansion between 3 ppm/K to 17 ppm/K | silicone foam having a modulus of elasticity <0.1 MPa |
| 6 | mold compound having a modulus of elasticity >1 GPa and a coefficient of thermal expansion between 3 ppm/K to 17 ppm/K | gel having a modulus of elasticity <0.1 MPa |
| 7 | conformal silicone-based coating having a modulus of elasticity >0.14 MPa | gel having a modulus of elasticity <0.1 MPa |
| 8 | conformal silicone-based coating having a modulus of elasticity >0.14 MPa | silicone foam having a modulus of elasticity <0.1 MPa |

Example 1

The first encapsulation (51) is a silicone having a first modulus of elasticity >0.14 MPa, and the second encapsulation (52) is a gel having a second modulus of elasticity <0.1 MPa.

Example 2

The first encapsulation (51) is a gel having a first modulus of elasticity >0.14 MPa, and the second encapsulation (52) is a gel having a second modulus of elasticity <0.1 MPa.

Example 3

The first encapsulation (51) is a gel having a first modulus of elasticity >0.14 MPa, and the second encapsulation (52) is a silicone foam having a second modulus of elasticity <0.1 MPa.

Example 4

The first encapsulation (51) is a silicone having a first modulus of elasticity >0.14 MPa, and the second encapsulation (52) is a silicone foam having a second modulus of elasticity <0.1 MPa.

Example 5

The first encapsulation (51) is a mold compound having a first modulus of elasticity >1 GPa and a coefficient of thermal expansion between 3 ppm/K to 17 ppm/K, and the second encapsulation (52) is a silicone foam having a second modulus of elasticity <0.1 MPa.

Example 6

The first encapsulation (51) is a mold compound having a first modulus of elasticity >1 GPa and a coefficient of thermal expansion between 3 ppm/K to 17 ppm/K, and the second encapsulation (52) is a gel having a second modulus of elasticity <0.1 MPa.

Example 7

The first encapsulation (51) is a conformal silicone-based coating having a first modulus of elasticity >0.14 MPa, and the second encapsulation (52) is a gel having a second modulus of elasticity <0.1 MPa.

Example 8

The first encapsulation (51) is a conformal silicone-based coating having a first modulus of elasticity >0.14 MPa, and the second encapsulation (52) is a silicone foam having a second modulus of elasticity <0.1 MPa.

Disposing the semiconductor chip, the first encapsulation and the second encapsulation may each take place at an arbitrary stage of the production process inside a module housing. That is, aside from the fact that the first encapsulation is applied to the semiconductor chip mounted on the substrate and subsequently the second encapsulation is applied to the arrangement comprising the substrate, the semiconductor chip mounted on the substrate and the first encapsulation applied thereto, each of the semiconductor chip, the first encapsulation and the second encapsulation may be disposed in the module housing at any time during the production process.

For instance, the first encapsulation may be applied to the semiconductor chip mounted on the substrate. Subsequently, the substrate with the semiconductor chip and the applied first encapsulation may be disposed inside the module housing, and, after that, the second encapsulation may be disposed inside the module housing.

Alternatively or additionally, the first encapsulation may be applied to the semiconductor chip pre-mounted on the substrate, to subsequently apply the second encapsulation to the applied first encapsulation, and to then dispose the substrate with the semiconductor chip and the applied first and second encapsulations inside the module housing.

According to a further alternative, the substrate and the semiconductor chip mounted thereon may be disposed inside the module housing. Subsequently, the first and then the second encapsulation may be disposed inside the module housing.

Figure 5:
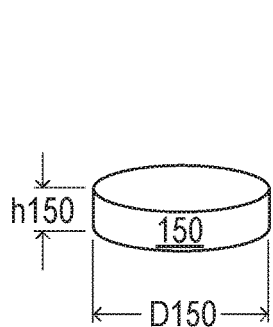
FIG. 5 is a schematic diagram illustrating a perspective view of a cylindrical probe taken from an encapsulation.

The moduli of elasticity mentioned in the present specification and the claims may be determined as subsequently described with reference to FIGS. 5, 6A and 6B. As illustrated in FIG. 5, a cylindrical sample 150 (i.e. a sample having the shape of a right circular cylinder) of the encapsulation to be evaluated (e.g. the first, second or third encapsulation 51, 52, 53) is prepared. The cylindrical sample 150 has a height h150 of 6 mm and a diameter D150 of 20 mm. The sample 150 may be prepared by punching out a cylinder having a height of more than 6 mm and cutting it so as to achieve a right circular cylinder having top and bottom faces plane parallel to each other. The sample 150 may be taken directly from a semiconductor module, or from an encapsulation that has been produced based on the same composition and the same production method as the encapsulation to be evaluated.

Figure 6A:
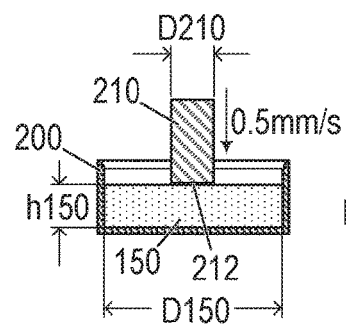
FIGS. 6A and 6B are schematic diagrams illustrating different steps of a method for determining the modulus of elasticity of the example shown in FIG. 5.
Figure 6B:
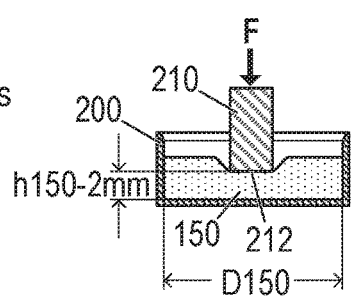

As shown in FIG. 6A, the sample 150 is placed inside of a rugged tube 200 (e.g. made of steel). The interior of the tube 200 has the shape of a right circular cylinder and a diameter (which is identical with the inner diameter of the tube 200) of 20 mm so that the lateral surface of the probe 150 substantially abuts against the inner surface of the tube 200. When being placed inside the tube 200, the sample 150 is compressed using a rugged probe 210 (e.g. made of steel) having the shape of a right circular cylinder with a diameter D210 of 6 mm and a plane, circular bottom side 212. Prior to compressing the sample 150, the probe 210 is placed centrally on the sample 150 with the bottom side 212 facing the sample 150 so that the bottom side 212 abuts the sample 150 but without substantially compressing the sample 150. The cylinder axes of the interior of the tube 200, the sample 150 and the probe 210 run parallel to one another. Then, the probe 210 is moved at a speed of 0.5 mm/s for a distance of 2 mm in a direction parallel to its cylinder axis towards the sample 150 to reach a target position which is illustrated in FIG. 6B. In that target position, a force F required for compressing the sample 150 is measured. The direction of the force F runs parallel to the cylinder axis of the probe 210. Using that force F, the sample's 150 modulus of elasticity E can be calculated as follows:

$$E = \frac{4 \cdot F}{D210^2 \cdot \pi}$$

That is, E is the ratio between the force F and the area A212 of the bottom side 212 with $A212 = 0.25 \cdot D210^2 \cdot \pi \approx 28.2.7$ mm². It is to be noted that the moduli of elasticity and the measuring process mentioned and described herein above are based on a sample 150 temperature of 25° C.

As used herein, to the extent to which expressions such as, for instance, "contain", "have", "having" or variants thereof are used either in the detailed description or in the claims, it should be understood that such expressions are intended to be inclusive in a manner similar to the expressions "encompass" and "comprise". Expressions such as "by way of example" is intended to denote merely an example and not the best or optimum example in accordance with any given criterion.

Even if a specific feature or a specific aspect of an embodiment of the invention may have been disclosed with regard to only one of a plurality of implementations, such a feature or such an aspect can be combined with one or a plurality of other features or aspects of the other implementations, as may be desirable and advantageous for an arbitrary given or determined application.

What is claimed is:

1. A power semiconductor module, comprising:
a module housing;
a substrate;
a semiconductor chip attached to the substrate and disposed in the module housing;
a dielectric first encapsulation disposed in the module housing, in physical contact with both the semiconductor chip and the substrate, and having a first modulus of elasticity;
a dielectric second encapsulation disposed in the module housing and having a second modulus of elasticity,
wherein the first encapsulation is a polymer and disposed between the substrate and the second encapsulation,
wherein the semiconductor chip is disposed between the first encapsulation and the substrate,
wherein the first modulus of elasticity is greater than the second modulus of elasticity,
wherein the second modulus of elasticity is, at a temperature of 25° C., less than 0.1 MPa.

2. The power semiconductor module of claim 1, wherein the first modulus of elasticity is, at a temperature of 25° C., more than 0.14 MPa or more than 1 GPa.

3. The power semiconductor module of claim 1, wherein the first encapsulation adjoins the second encapsulation.

4. The power semiconductor module of claim 1, wherein the second encapsulation comprises at least one of a gel and a silicone foam.

5. The power semiconductor module of claim 1, wherein the first encapsulation adjoins a semiconductor body of the semiconductor chip.

6. The power semiconductor module of claim 1, wherein the first encapsulation is a conformal coating.

7. The power semiconductor module of claim 1, wherein the semiconductor chip is disposed between a first side wall and a second side wall of the module housing, and wherein the first encapsulation extends continuously between the first side wall and the second side wall.

8. The power semiconductor module of claim 1, wherein the semiconductor chip is disposed between a first side wall and a second side wall of the module housing, and wherein the second encapsulation extends continuously between the first side wall and the second side wall.

9. The power semiconductor module of claim 1, wherein at least one of: the first encapsulation comprises, in a direction perpendicular to the substrate, a first height of less than the thickness of the semiconductor chip plus 400 μm; and the second encapsulation comprises, in a direction perpendicular to the substrate, a second height of at least 3 mm.

10. The power semiconductor module of claim 1, wherein the semiconductor chip is completely disposed between the first encapsulation material and the substrate.

11. The power semiconductor module of claim 1, further comprising:
a bond wire,
wherein the semiconductor chip comprises a first chip metallization,
wherein the bond wire is, at a first bonding location, directly bonded to the first chip metallization,
wherein the bond wire is, at least at the first bonding location, embedded in the first encapsulation.

12. The power semiconductor module of claim 11, wherein the substrate comprises a dielectric insulation carrier, and a first substrate metallization layer attached to the insulation carrier, wherein the semiconductor chip is disposed on the first substrate metallization layer, and wherein the bond wire is, at a second bonding location, directly bonded to the first substrate metallization layer.

13. A method for producing a power semiconductor module, the method comprising:
   coating a semiconductor chip and a substrate to which the semiconductor chip is attached with a dielectric first encapsulation, so that the first encapsulation is in physical contact with both the semiconductor chip and the substrate and the semiconductor chip is disposed between the first encapsulation and the substrate;
   curing the first encapsulation so that the cured first encapsulation has a first modulus of elasticity;
   disposing a dielectric second encapsulation on the first encapsulation;
   curing the second encapsulation so that the cured second encapsulation has a second modulus of elasticity; and
   disposing the semiconductor chip, the first encapsulation and the second encapsulation inside a module housing,
   wherein the cured first encapsulation is a polymer,
   wherein the first modulus of elasticity is greater than the second modulus of elasticity,
   wherein the second modulus of elasticity is, at a temperature of 25° C., less than 0.1 MPa.

14. The method of claim 13, wherein the semiconductor chip is, prior to being coated with the first encapsulation, a bare semiconductor die, and wherein coating the semiconductor chip and the substrate comprises coating the semiconductor chip so that the first encapsulation adjoins a semiconductor material of the semiconductor chip.

15. A power semiconductor module, comprising:
   a module housing;
   a substrate;
   a semiconductor chip attached to the substrate and disposed in the module housing;
   a dielectric first encapsulation disposed in the module housing, in physical contact with both the semiconductor chip and the substrate, and having a first modulus of elasticity;
   a dielectric second encapsulation disposed in the module housing and having a second modulus of elasticity,
   wherein the first encapsulation is a polymer and disposed between the substrate and the second encapsulation,
   wherein the semiconductor chip is disposed between the first encapsulation and the substrate,
   wherein the first modulus of elasticity is greater than the second modulus of elasticity,
   wherein the first encapsulation is a conformal coating.

* * * * *